(12) United States Patent
Ma et al.

(10) Patent No.: US 7,228,521 B1
(45) Date of Patent: Jun. 5, 2007

(54) SYSTEM FOR OPERATING A PROGRAMMABLE LOGIC DEVICE HAVING A DEFECTIVE REGION

(75) Inventors: Jing Hua Ma, San Jose, CA (US); Benhai Zhang, San Jose, CA (US)

(73) Assignee: XILINX Inc., San Jose, CA (US)

( * ) Notice: Subject to any disclaimer, the term of this patent is extended or adjusted under 35 U.S.C. 154(b) by 142 days.

(21) Appl. No.: 11/048,333

(22) Filed: Feb. 1, 2005

(51) Int. Cl.
*G06F 17/50* (2006.01)
*H03K 19/00* (2006.01)

(52) U.S. Cl. .............................. 716/17; 716/12; 716/14
(58) Field of Classification Search ................ 716/1–7, 716/17–18, 12, 14; 714/25, 710, 718, 723, 714/798, 799; 713/1, 2, 100
See application file for complete search history.

(56) References Cited

U.S. PATENT DOCUMENTS

| 4,547,882 A | * | 10/1985 | Tanner ....................... 714/755 |
| 5,430,734 A | * | 7/1995 | Gilson ........................ 714/725 |
| 5,708,667 A | * | 1/1998 | Hayashi ...................... 714/755 |
| 5,758,056 A | * | 5/1998 | Barr .............................. 714/7 |
| 5,844,422 A | | 12/1998 | Trimberger et al. |
| 6,530,071 B1 | * | 3/2003 | Guccione et al. ............. 716/17 |
| 6,950,771 B1 | * | 9/2005 | Fan et al. ................... 702/117 |
| 7,047,465 B1 | * | 5/2006 | Trimberger ................. 714/725 |
| 7,127,697 B1 | * | 10/2006 | Wells et al. .................. 716/16 |
| 2005/0015654 A1 | * | 1/2005 | Marr ............................. 714/6 |

* cited by examiner

*Primary Examiner*—Paul Dinh
*Assistant Examiner*—Nghia M. Doan
(74) *Attorney, Agent, or Firm*—Scott Hewett (57) ABSTRACT

A code is generated for a programmable logic device ("PLD") having a plurality of regions including at least one defective region. The code indicates a defective region or regions of the PLD. A user enters the code before running placement and routing. A guide file associated with the code blocks out the defective region(s) of the PLD during placement and routing.

15 Claims, 5 Drawing Sheets

SYSTEM FOR OPERATING A PROGRAMMABLE LOGIC DEVICE HAVING A DEFECTIVE REGION

FIELD OF THE INVENTION

The present invention relates generally to types of integrated circuits ("ICs") generally known as programmable logic devices ("PLDs"), and more particularly to techniques for isolating defective areas of a PLD using configuration data to allow operation of the remaining areas.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored on-chip in non-volatile memory, then downloaded to volatile memory as part of an initial configuration sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable.

PLDs are typically relatively complex and physically large ICs. This presents many challenges for manufacturing PLDs. The large chip size means that fewer chips are produced per wafer, and increases the chances that a physical defect, such as a dust particle on any portion of the chip during any of several processing steps, will cause an electrical fault. The complexity (e.g. the minimum critical dimension and number of layers) of PLDs also increases the possibility for electrical faults. PLD chips are tested after fabrication. Chips are binned according to performance, such as operating speed, as well as for pass/fail. The percentage of usable chips is called "silicon yield" because it indicates how many chips from a wafer(s) are usable.

Techniques for increasing silicon yield are highly desirable.

SUMMARY OF THE INVENTION

A code is generated for a programmable logic device ("PLD") having a plurality of regions including at least one defective region. The code indicates a defective region or regions of the PLD. A user enters the code before running placement and routing. A guide file associated with the code blocks out the defective region(s) of the PLD during placement and routing.

DETAILED DESCRIPTION OF THE DRAWINGS

Figure 1:
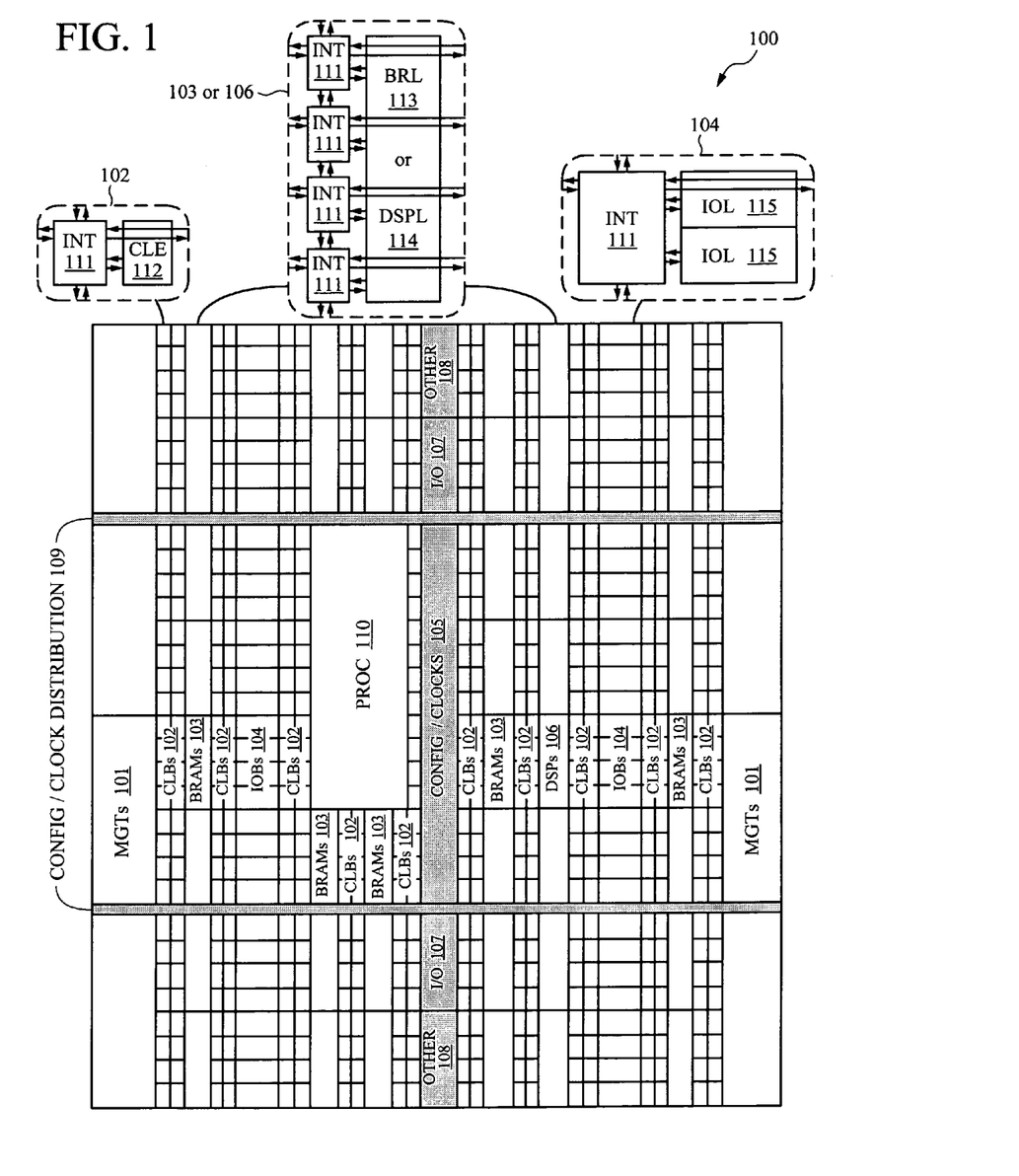
FIG. 1 is a plan view of an FPGA suitable for implementing embodiments of the invention.

As noted above, advanced FPGAs can include several different types of programmable logic blocks in the array. For example, FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic.

Figure 2A:
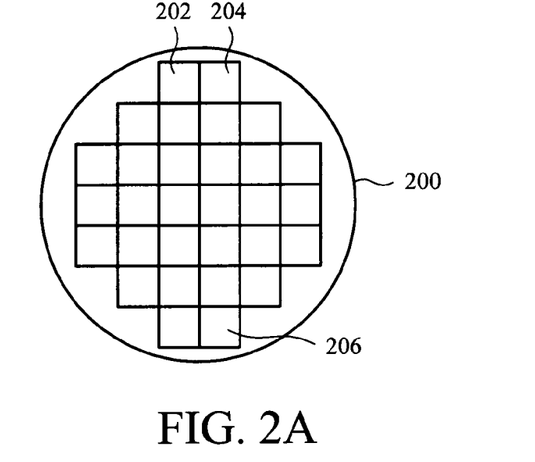
FIG. 2A is a plan view of a silicon wafer showing programmable logic devices.

FIG. 2A is a plan view of a silicon wafer 200 showing programmable logic devices, such as FPGAs 202, 204, 206, only a few of which are indicated with reference numerals, that will eventually become dice, which are then packaged. For example, FPGA 202 will become die 1, FPGA 204 will become die 2, FPGA 206 will become die 3, and so forth. The FPGAs are tested in a process known as "wafer test" before the FPGA dice are separated from the wafer. In conventional wafer test, defective dice are often marked with a spot of ink, and inked dice are discarded after the dice are separated from the wafer, such as by scribing and breaking, or by sawing or other techniques.

However, some embodiments of the invention store test results for each FPGA in an inkless map. In particular embodiments, test results for several separate regions on each die are stored in an inkless map according to a code assigned to, and associated with, the die. The regions are organized relating to their physical location on the die in some embodiments. Alternatively, the regions are organized according to their functionality. Generally, one is not limited organize regions physically or functionally, and how a user chooses to organize regions of a device depends on that device's layout and functional design.

Figure 2B:
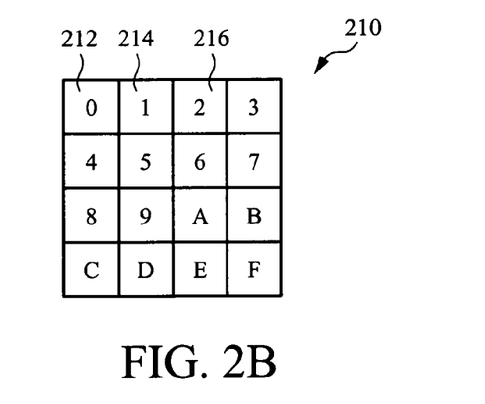
FIG. 2B is a plan view of an FPGA segmented into sixteen regions.

FIG. 2B is a plan view of an FPGA 210 segmented into sixteen regions 212, 214, 216, only a few of which are indicated with reference numerals. The regions are merely exemplary. The regions are not necessarily the same size or evenly distributed on the die, and a die is alternatively organized into more or fewer regions. The sixteen regions are represented by hexadecimal numbers (shown in the approximate middle of each region) 0–9 and A–F. Using hexadecimal numbers are desirable because more than ten regions can be represented with a single character. The regions are designated using other types of representation systems in alternative embodiments. Similarly, the representation system does not have to be sequential, and does not have to start in a corner and continue across a row; however, the hexadecimal representation shown provides a convenient example for discussion.

Table 1 is a chart illustrating an embodiment of how to designate test result data:

TABLE 1

| | |
|---|---|
| . | Bad die |
| — | Empty area on wafer |
| G | All regions on die are good |
| 0 | Region 0 defective |
| 1 | Region 1 defective |
| 2 | Region 2 defective |
| 3 | Region 3 defective |
| 4 | Region 4 defective |
| 5 | Region 5 defective |
| 6 | Region 6 defective |
| 7 | Region 7 defective |
| 8 | Region 8 defective |
| 9 | Region 9 defective |
| A | Region A defective |
| B | Region B defective |
| C | Region C defective |
| D | Region D defective |
| E | Region E defective |
| F | Region F defective |

For example, each die of a wafer having thirty FPGAs is represented as a one-character code in the data string "G123AG3478B312G4566.GG1BA.CDGG". The first, sixth, fifteenth, twenty-first, twenty-second, twenty-ninth, and thirtieth FPGAs are OK (all regions are good). The twentieth and twenty-sixth FPGAs are bad, which in this example means that those FPGAs have more than one defective region. Other FPGAs on the wafer have defects in various regions indicated by the code designation. This technique screens good FPGAs and those having a single defective region from those having more than one defective region. A defective region may have more than one defect.

Figure 2C:
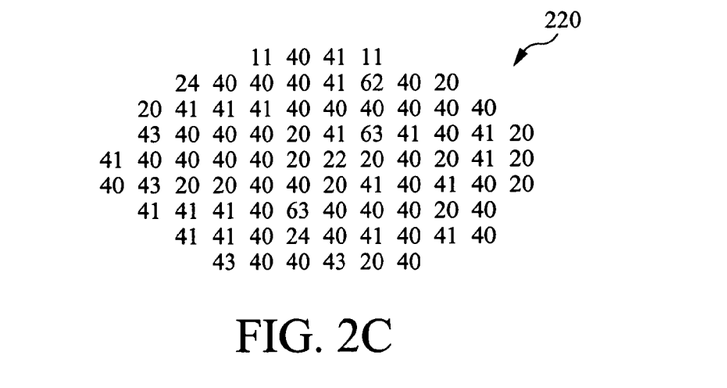
FIG. 2C is an example of an inkless map of a silicon wafer.

FIG. 2C is an example of an inkless map 220 of a silicon wafer. The silicon wafer has eighty-two devices that will be separated into individual dice, each device being represented by a two-digit base-ten code (e.g. 11, 40, 41, and 11 in the top row of devices). Alternatively, a hexadecimal code is used. A two-digit base-ten code can identify 100 different types of devices (e.g. all-good plus 99 types of defective segments or combinations of segments). For example, single-region defects can be identified in a device segmented into 100 regions, or two-region defects can be identified in a device segmented into ten regions. The inkless map is associated with a wafer number, and similar inkless maps are generated for other wafers.

Inkless maps are desirable because they do not physically alter the devices on the wafer. In conventional wafer test, a failed device is marked with a dot of ink. The inkless map allows the manufacturer to utilize devices with defective segments that would otherwise be discarded by identifying the defective regions within devices, and by not physically altering the devices.

Inkless maps according to some embodiments of the invention also provide more insight into failure locations and mechanisms because, rather than merely inking a bad device, the inkless map shows the manufacturer not only where on the wafer defects are occurring, but where (i.e. in which segments) defects are occurring within each device. For example, defective regions (and hence failure mechanisms) might be different from one region of the wafer to another. Conventional inking shows where on a wafer devices are failing, but does not map the defective segments.

Figure 3A:
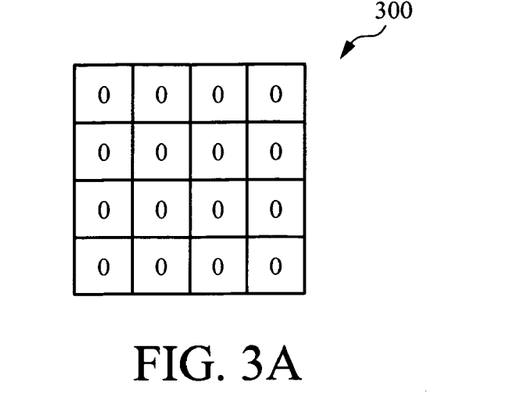
FIGS. 3A–3C show examples of programmable logic devices having regions represented by 4-bit hexadecimal numbers ("Hex").
Figure 3B:
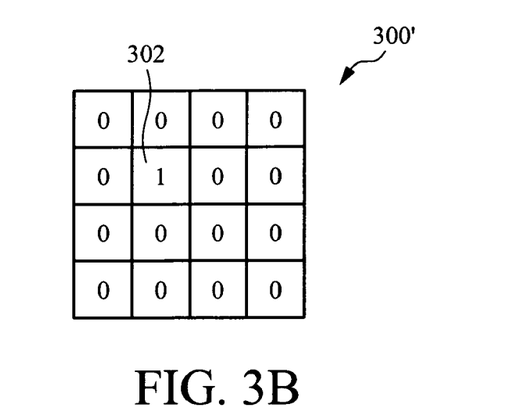
Figure 3C:
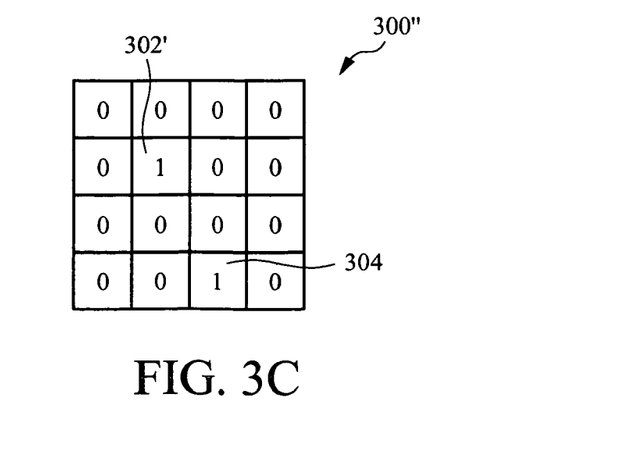

FIGS. 3A–3C show examples of programmable logic devices having regions represented by 4-bit hexadecimal numbers ("Hex"). FIG. 3A shows a PLD 300, such as an FPGA, having sixteen regions, which are represented in 4-bit Hex. From left to right, the first Hex represents the first row, and the second Hex represents the second row, and so on. A "0" represents that the region is good, and a "1" represents that the region has a defect. Thus, the PLD 300 has sixteen good regions, which is represented by hx0000.

FIG. 3B shows an example of a PLD 300' that has defects only in region five 302. The first row is 0000, which equals hx0. The second row is 0100, which equals hx4. The third and forth rows are also each hx0. The sixteen-region PLD is represented as hx0400.

FIG. 3C shows an example of a PLD 300" that has defects in region five 302' and in region fourteen 304. The first and third rows are both hx0. The second row is 0100, which equals hx4, and the fourth row is 0010, which is hx2. Thus, the sixteen-region PLD 300" is represented as hx0402.

Referring to FIG. 2A and the hexadecimal system illustrated in FIGS. 3A–3C, the test result for each region of each device on a wafer can be stored in an inkless map (not shown) of the wafer on a computer-storage medium of a test station, for example. Following the examples above, for a device (e.g. a PLD, such as an FPGA) having sixteen regions, the test results for each device is stored as a 4-bit hexadecimal number. Table 2 provides an example of one way to label device test results:

TABLE 2

| Label | Detected Region(s) | Notes |
| --- | --- | --- |
| FFFF | Bad die | All regions defective |
| — | Empty area | |
| 0000 | All regions pass | Good die |
| 8000 | Region 0 fails | One defective region |
| 4000 | Region 1 fails | " |
| ... | ... | ... |
| 0001 | Region F fails | " |
| 8001 | Regions 0, F fail | Two defective regions |
| 8002 | Regions 0, E fail | " |
| ... | ... | ... |
| 1800 | Regions 3, 4 fail | " |
| E000 | Regions 0, 1, 2 fail | Three defective regions |
| 1C00 | Regions 3, 4, 5, fail | " |
| 2180 | Regions 2, 7, 8 fail | " |
| ... | ... | ... |

Each region of each device can be mapped using hexadecimal notation in a data string; however, instead of each device being represented by a single character, as with the example described in conjunction with Table 1, each device is represented by a four-character code. For example, the data string: 000040008001 . . . means that the first device (die) is good, the second device has a single defective region, region 1, and regions 0 and F are defective in the third device. Alternatively, commas or other separators are included in a data string to designate between codes representing regions of a device, such as: 0000, 4000, 8002, . . .

Separating a PLD into multiple regions provides advantages at wafer test/sort, as well as at final test (i.e. after packaging). Using the sixteen-region FPGA 210 of FIG. 2B as an example, each region of the FPGA is represented with a Hex number. The FPGA is partitioned into the sixteen regions according to logical function, rather than physical location. For example, some functional regions are transceivers, I/O blocks, CLBs, and/or BRAMs. A test program is created for each of the sixteen regions, or alternatively for each different type of region. The sixteen partitioned patterns reside in one test program, or alternatively in sixteen test programs.

The amount of overhead is based on the partition algorithm. In the final test program, binning of the packaged devices is selective according to the regional failures. For example, an operator selects devices with all good regions to a first bin, devices with a particular regional failure (e.g. a region 0 failure only) to a second bin, and so forth. Binning at final test is facilitated using an inkless map from wafer test, which can pre-sort devices by assigning a bin code to each device at wafer test according to the binning categories at final test.

Multiple types (bins) of parts can be used to fill orders. For example, if a customer uses part number 8001, which indicates that regions 0 and F are defective, an order for this customer can be filled using part numbers 0000 (no defective regions), 8000 (region 0 failure), 0001 (region F failure), and 8001 (both regions 0 and F fail). Thus, four different part numbers may be used in this example. The load file, placement, and routing does not have to be changed for each part number because software to configure a device to operate without using regions 0 and F would work with part numbers 0000, 8000, 0001, and 8001.

In particular embodiments, partitioning is done using smart patterns that can output a flag to indicate the failure region. Techniques, such as partial configuration and zero-frame write operations are used in some embodiments to save configuration time. Testing multiple regions at the same time can also be used to reduce test time, such as testing one row or column at the same time. For example, the first column, which contains r0, r4, r8, rC (representing region 0, region 4, region 8 and region C in FIG. 2B), is tested, and then the second column, which contains r1, r5, r9, and rD, is tested.

A guide file is used to block out defective regions of a device during configuration. A guide file is a user file provided to the user by the manufacturer of the device. Generally, the guide file is used with placement and routing ("P&R") to block out (exclude) defective regions from being used by P&R. Basically, the guide file tells the P&R routine not to place logic or other functions of the device in an excluded region. A guide file is usable with a programmable logic device because the device hardware is configurable (programmable).

The following is an example of a guide file written in physically contained file ("PCF") text format, which is commonly used with FPGAs manufactured by Xilinx, Inc., and is easily converted to other formats:

COMP "ICAP" LOCATE=SITE "ICAP";
COMP "ICAP_CCLK" LOCATE=SITE "C8";
COMP "ICAP_CS" LOCATE=SITE "C3";
COMP "ICAP_RDWR" LOCATE=SITE "C2";
COMP "ICAP_BUSY" LOCATE=SITE "B3";
COMP "ICAP_D0" LOCATE=SITE "E3";
COMP "ICAP_D1" LOCATE=SITE "E2";
COMP "ICAP_D2" LOCATE=SITE "E4";
COMP "ICAP_D3" LOCATE=SITE "F5";
COMP "ICAP_D4" LOCATE=SITE "F4";
COMP "ICAP_D5" LOCATE=SITE "F3";
COMP "ICAP_D6" LOCATE=SITE "A2";
COMP "ICAP_D7" LOCATE=SITE "A3";
PROHIBIT=SITE SLICE_X72Y65;
PROHIBIT=SITE SLICE_X77Y68;
PROHIBIT=SITE SLICE_X78Y30;
PROHIBIT=SITE SLICE_Z79Y70;
PROHIBIT=SITE SLICE_X80Y37;
PROHIBIT=SITE SLICE_X80Y75;
PROHIBIT=SITE SLICE_X81Y31;
PROHIBIT=SITE SLICE_X81Y37;
PROHIBIT=SITE SLICE_X81Y74;
PROHIBIT=SITE SLICE_X82Y42;
PROHIBIT=SITE SLICE_X82Y65;
PROHIBIT=SITE SLICE_X82Y73;
PROHIBIT=SITE SLICE_X83Y29;
PROHIBIT=SITE SLICE_X83Y64;
PROHIBIT=SITE SLICE_X83Y65;
PROHIBIT=SITE SLICE_X84Y41;
PROHIBIT=SITE SLICE_X90Y19;
PROHIBIT=SITE SLICE_X91Y19;
PROHIBIT=SITE SLICE_X91Y46;
PROHIBIT=SITE SLICE_X93Y26;
PROHIBIT=SITE SLICE_X94Y24;
PROHIBIT=SITE SLICE_X94Y27;
PROHIBIT=SITE SLICE_X95Y26;

In this example, the guide file is read during device configuration or net listing. The vendor of the PLD typically provides the guide file and P&R software that allows a user to net list and/or configure a PLD for the user's application. Alternatively, a user or third party generates the guide file. As shown above, the guide file prohibits access to particular columns and slices of the PLD. PLDs often have a particular pin assigned to a particular location that allows logic to be placed in certain locations on the PLD. Once the PLD has been segmented and tested, the guide file designates a row, column, slice, and/or block of the PLD as unavailable. The segments can be physical, logical, or combine both physical and logical attributes.

A user-constrained file ("UCF") is a file that configures an FPGA to operate in a particular manner using particular resources in particular locations on the FPGA. A guide file may be thought of as an inverse UCF because it tells the user which resources not to use when configuring the device for a specific application. A serial number, such as a 4-bit Hex, associated with a device, such as a sixteen-region FPGA, indicates which guide file should be used for that particular device. For example, a Hex of 8001 indicates that region 0 and region F are defective, and the associated guide file prohibits P&R from using regions 0 and F. The user can use the rest of the FPGA.

In some embodiments, parts having defective regions are provided with lower specifications. For example, if an I/O block is excluded from use by the guide file, the part having the associated serial number (code) has fewer I/O resources than a device that has no defective regions. In a particular embodiment, the manufacturer provides a library of guide files containing the appropriate guide file for each of the codes for a particular device. This allows a user to utilize any of a number of devices having different codes. Alternatively, the manufacturer provides a guide file with a particular device.

In many instances, the remaining regions are more than suitable for the application intended by the user. This technique greatly increases the possible silicon yield. In some instances, only FPGAs with all or at least many defective regions are considered bad. The others are binned according to their defective regions.

Before running P&R, the user enters the serial number (code), which selects and loads the associated guide file. In a particular embodiment, a user entry step is added to standard P&R software (typically supplied to the user by the manufacturer of the device). After entering the serial number of the device, configuration and use of the device is transparent to the user. That is, use of the device is the same as before, except for the extra step of entering the device code.

Using a serial number code when binning the devices allows a buyer to select parts, including replacement parts, according to his needs. For example, a buyer who needs premium parts may select parts with Hex serial number 0000. A buyer who does not need all regions (many of which are repeated throughout the device) to be operational, such as for use in a relatively simple application, might select a device having multiple defective regions, which he obtains at a lower price.

Some types of faults affect the performance and/or reliability of the FPGA, such as a power supply fault. For example, a short from $V_{CC}$ to ground in one region can pull down $V_{CC}$ in other regions. However, FPGAs with regional power supplies can avoid a power supply defect in one region from affecting the other regions by switching power to the defective region off. Switching off power to a defective region can improve operation and lifetime by reducing the overall power requirement of the FPGA by the amount that would have otherwise been used by the defective region(s).

Embodiments of the invention enables greater silicon yield. Embodiments are also desirable for early stage debugging by identifying regions that fail, which can facilitate the design cycle and bring a product to market sooner. Embodiments of the invention are particularly desirable for use with high-density PLDs, which are typically devices having more than 3 million gates, because they allow shipments without long lead times because devices can be shipped for applications that do not require 100% usable die area.

Figure 4:
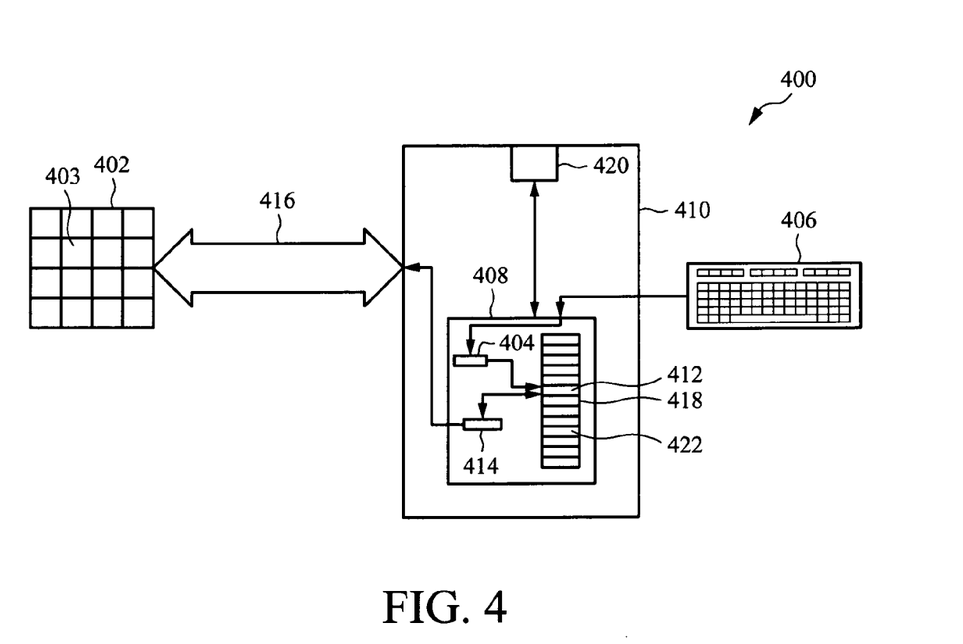
FIG. 4 shows a system according to an embodiment of the invention.

FIG. 4 shows a system 400 according to an embodiment of the invention. A PLD 402 has been segmented into a plurality of regions (see FIG. 3B) including at least one defective region 403 (see also, FIG. 3B, ref. num. 302). In one embodiment, the PLD 402 has a single defective region 403. In alternative embodiments, the PLD has multiple defective regions.

A code (e.g. part number) 404 associated with the PLD 402 is entered by a user (not shown) at a user input device 406 and is stored in random-access memory ("RAM") 408 of a computer 410. Alternatively, the code is entered by inserting a computer-readable medium into a drive 420, such as a magnetic disc drive, optical disk, drive, read-only memory ("ROM"), or tape drive, and is either stored in RAM or read directly from the computer-readable medium. The code indicates which region(s) of the PLD 402 are defective, and should not be used (i.e. are unavailable) during device configuration.

A guide file 412 in the RAM 408 operates in conjunction with the code 404 P&R software 414 to generate a bit stream configure the PLD 402 over a bus 416. The guide file 412 is contained in a library 418 that is usually loaded into RAM 408 from a computer-readable medium by the drive 420 of the computer 410. Alternatively, the code, guide file, and/or place and route (P&R) software is accessed from system memory external to the computer 410, such as system memory (not shown) or a remote server (not shown). In a particular embodiment, the guide file and P&R software is retrieved by the computer 410 from a remote server (not shown) maintained by a vendor of the PLD 402. The remote server is connected to the computer 410 over a network (not shown). The computer 410 configures the PLD 402 according to the guide file 412, which blocks the P&R software 414 from using the defective region of the PLD 402. If a second PLD (not shown) having a different code (not shown) is configured, a second guide file 422 from the library 418 is used during P&R. The same guide file may be used for multiple codes in some applications, such as when a guide file associated with multiple defective regions.

Figure 5:
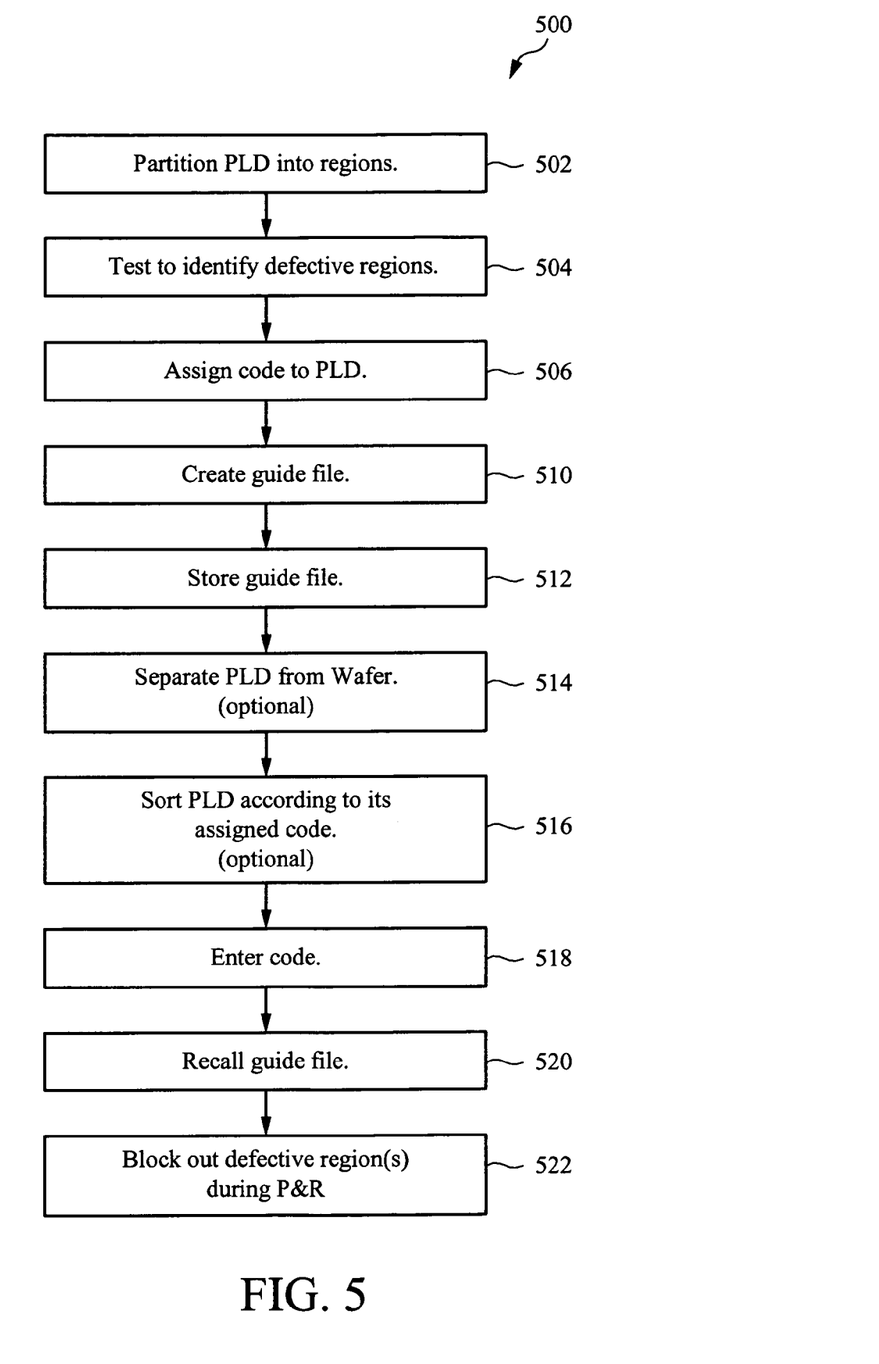
FIG. 5 is a flow chart of method of operating a PLD according to an embodiment of the invention.

FIG. 5 is a flow chart of method 500 of operating a PLD according to an embodiment of the invention. A PLD is partitioned into a plurality of regions (step 502). A test is run on the PLD to identify defective regions of the PLD (step 504). A code, such as a serial number, that identifies which regions, if any, of the PLD are defective and which regions are good, is assigned to the PLD (step 506). A guide file associated with the code is created (step 510) and stored on a computer-readable medium (step 512). Alternatively, steps 510 and 512 are performed before steps 504 and 506.

In one embodiment, the PLD is part of a wafer, and the test is a wafer test. The method optionally includes steps of separating the PLD from the wafer (step 514) and sorting the PLD according to the code (step 516). In an alternative embodiment, the PLD is separated from the wafer, and the test is a chip test or final test of a packaged PLD. The packaged PLD with the code and the associated guide file is provided to a user (e.g. a customer or an internal user). The guide file is typically stored on computer-readable media, such as a disc at a server or on an optical disc.

In a particular embodiment, several guide files for a particular type of PLD are provided in a library. In a further embodiment, the code is entered as an initial part of the P&R routine, and the P&R routine automatically reads the appropriate guide file from the library according to the entered code. In a further embodiment, a user enters the code (step 418), the guide file is recalled from the computer-readable medium (step 520), and defective regions of the PLD are blocked out (step 522) during P&R.

When the PLD is provided to a user, the user enters the code before mapping the device and before place and route. The user can reorder PLDs with the same code if he desires PLDs with the same regions blocked out.

Yield enhancement from the wafer for a particular type of PLD depends on the size of individual dice and other factors, such as the critical minimum dimension of the fabrication process and number of layers. Generally, a physically larger device will have a greater chance of including a defect. A wafer also yields fewer large parts, compared to physically smaller PLDs. For example, PLD sizes range from about 36 mm$^2$ to about 540 mm$^2$.

Actual silicon yield data and defect analysis was used to predict the expected yield improvement using an embodiment of the invention. A silicon wafer having a diameter of about 300 mm was used for purposes of comparison, but is merely exemplary.

Silicon yield for a PLD having an area of 36 mm$^2$ was used as a standard to which other die sizes were compared, and it was assumed that the fabrication defect density was constant for a wafer, and therefore the yield scaled with die area. This was confirmed using silicon yield data for a variety of parts having different die sizes. It is predicted that by using techniques according to the invention to utilize parts with a single defective segment will improve the silicon yield of a device approximately four times the size (i.e. having 5.6 times the surface area) of the standard by about 40%, of a device approximately 7.4 times the size of the standard by about 49%, of a device approximately 11.6 times the size of the standard by about 63%, and of a device approximately 15 times the size of the standard by about 70%.

The largest PLD in this example was segmented into 14 regions, and the ability to improve silicon yield by blocking out a single region is expected to improve silicon yield by 70%. Thus, techniques according to embodiments of the invention are particularly desirable for improving the silicon yield of large device, especially since there are fewer large devices.

PLDs having blocked-out regions, and which might otherwise be discarded, are useful in the development (prototyping) of application-specific integrated circuits ("ASICs"), including application-specific signal processors (ASSPs"). High-frequency, particularly FPGAs having I/O ports operating above 1.5 GHz, with blocked-out regions are very desirable for use as re-programmable ASSPs. FPGAs according to embodiments of the invention offer all the benefits of conventional FPGAs at lower cost for many applications. They are flexible, programmable, and re-programmable. Binning devices that would otherwise be rejected and discarded provides more useful devices, increasing silicon yield. Techniques according to embodiments of the present invention are also useful for anti-fuse type logic devices, which are configured (programmed) through a bit stream.

While the present invention has been described in connection with specific embodiments, variations of these embodiments will be obvious to those of ordinary skill in the art. For example, rather than detecting defective regions during wafer test and assigning a code at that time, packaged devices can be tested to determine which regions are defective, and a code is then assigned to be shipped to the customer with the PLD. The latter approach avoids having to use an inkless map to track the dice, and is particularly desirable if the packaging cost is relatively low, such as when plastic encapsulation techniques are used. Lower-cost packaging techniques may be particularly applicable to PLDs having defective regions that reduce the power requirements of the PLD or for use in low-power applications. Alternatively, wafer sort with reduced testing can be combined with testing according to an embodiment of the invention after packaging. Therefore, the spirit and scope of the appended claims should not be limited to the foregoing description.

The invention claimed is:

1. A system comprising:
    a first programmable logic device segmented into a first plurality of regions having a selected number of regions including at least a first defective region;

a first code assigned to the first programmable logic device, the first code indicating the first defective region of the first programmable logic device;

a first guide file stored on a computer-readable medium and retrieved in response to the first code, the first guide file blocking the first defective region from being used during placement and routing of the first programmable logic device; and a second programmable logic device segmented into a second plurality of regions having the selected number of regions including at least a second defective region equivalent to the first defective region of the first programmable logic device, wherein the first code is further associated with the second programmable logic device indicating the second defective region, wherein the first guide file further blocks the second defective region during placement and routine of the second programmable logic device; and wherein the first programmable logic device is segmented into the selected number of regions according to at least one of logical segmentation of the first programmable logic device and physical segmentation of the first programmable logic device.

2. The system of claim 1 wherein the first programmable logic device is a field-programmable gate array.

3. The system of claim 1 wherein the first code has a single character.

4. The system of claim 3 wherein the single character is a hexadecimal character.

5. The system of claim 1 further comprising at least a third defective region of the first programmable logic device wherein the first code further indicates the third defective region and the first guide file further blocks the third defective region from being used during placement and routing.

6. The system of claim 1 wherein the first code has multiple characters, each of the multiple characters being a hexadecimal number.

7. The system of claim 6 wherein the first programmable logic device is segmented into the first plurality of regions according to rows and columns and each of the characters represents one of the rows or one of the columns.

8. The system of claim 1 wherein the first programmable logic device is incorporated in a wafer.

9. The system of claim 8 further comprising:

a third programmable logic device incorporated in the wafer segmented into a third plurality of regions having the selected number of regions;

a second code associated with the third programmable logic device; and a second guide file associated with the second code used during placement and routing of the third programmable logic device.

10. The system of claim 9 wherein the first code and the second code are stored in an inkless map of the wafer.

11. The system of claim 10 wherein the first programmable logic device and third programmable logic device are separately binned according to the first code and the second code stored in the inkless map.

12. A method of operating a first programmable logic device ("PLD") and a second PLD comprising:

partitioning the first PLD into a plurality of regions according to at least one of logical partitioning of the first PLD and physical partitioning of the first PLD;

running a test on the first PLD to identify defective regions of the first PLD;

assigning a code to the first PLD identifying the defective regions of the first PLD;

running the test on the second PLD to identify defective regions of the second PLD;

if the defective regions of the second PLD are equivalent to the defective regions of the first PLD, assigning the code to the second PLD creating a guide file associated with the code;

storing the guide file on a computer-readable medium;

entering the code prior to a placement and routing routine;

recalling the guide file from the computer-readable medium based on the entered code; and using the guide file to block out defective regions of the first PLD during the placement and routing routine.

13. The method of claim 12 wherein the test is a wafer test, and further comprising separating the first PLD from a wafer; and sorting the first PLD according to the code.

14. The method of claim 12 further comprising a step, prior to the step of running a test on the first PLD to identify defective regions of the first PLD, of packaging the first PLD.

15. The method of claim 12 wherein the step of storing the guide file includes storing the guide file in a library of guide files and the step of recalling the guide file includes recalling the guide file from the library of guide files.

* * * * *